United States Patent
Hill (10) Patent No.: US 8,187,484 B2
(45) Date of Patent: May 29, 2012

(54) DOWN-STREAM PLASMA ETCHING WITH DEFLECTABLE RADICAL STREAM

(75) Inventor: Jeff Alistair Hill, Munich (DE)

(73) Assignee: PVA TePla AG, Wettenberg (DE)

(*) Notice: Subject to any disclaimer, the term of this patent is extended or adjusted under 35 U.S.C. 154(b) by 908 days.

(21) Appl. No.: 12/083,138

(22) PCT Filed: Oct. 5, 2005

(86) PCT No.: PCT/EP2005/010741
§ 371 (c)(1),
(2), (4) Date: Apr. 5, 2008

(87) PCT Pub. No.: WO2007/038967
PCT Pub. Date: Apr. 12, 2007

(65) Prior Publication Data
US 2009/0242514 A1    Oct. 1, 2009

(51) Int. Cl.
*B44C 1/22* (2006.01)
*C03C 15/00* (2006.01)
*C03C 25/68* (2006.01)
*C23F 1/00* (2006.01)

(52) U.S. Cl. ............ 216/67; 438/710; 438/730
(58) Field of Classification Search .......... 216/67; 438/727, 730, 731
See application file for complete search history.

(56) References Cited

U.S. PATENT DOCUMENTS

| | | |
|---|---|---|
| 5,481,081 A | 1/1996 | Ikegaya et al. |
| 5,522,934 A | 6/1996 | Suzuki et al. |
| 5,614,026 A | 3/1997 | Williams |
| 7,303,141 B2 | 12/2007 | Han et al. |
| 2001/0015261 A1* | 8/2001 | Kobayashi et al. ............ 156/345 |
| 2003/0140851 A1* | 7/2003 | Janakiraman et al. ........ 118/715 |
| 2004/0149223 A1* | 8/2004 | Collison et al. .......... 118/723 IR |
| 2005/0093460 A1 | 5/2005 | Kim et al. |

FOREIGN PATENT DOCUMENTS

| | | |
|---|---|---|
| EP | 1 344 842 A2 | 9/2003 |
| JP | 2250976 A | 10/1990 |

* cited by examiner

Primary Examiner — Roberts Culbert
(74) Attorney, Agent, or Firm — Kriegsman & Kriegsman (57) ABSTRACT

The invention relates to a process for etching a substrate (3) in an etching chamber (1) with a plasma ignited outside of the etching chamber (1). The process is characterized in that during the etching process at least temporarily at least one gas jet (10) is directed from the side to the radical stream (7) which is directed towards the substrate (3). Furthermore the invention relates to an etching chamber for etching of a substrate (3) with a substrate holder (2) and a plasma source (4) remote to the substrate holder (2), which is characterized in that between the substrate holder (2) and the plasma source (4) at least one nozzle (9) for lateral introduction of a gas jet (10) into the etching chamber (1) is provided. With this invention the distribution of the active species on the surface of a substrate can be easily influenced.

5 Claims, 7 Drawing Sheets

DOWN-STREAM PLASMA ETCHING WITH DEFLECTABLE RADICAL STREAM

The present invention relates to a process of etching a substrate and to an etching chamber.

For the treatment of substrates, such as semiconductor substrates and wafers respectively, dry-etch processes have proven advantageous, as these processes can also be used for substrates of small thickness. The treatment of such thin substrates is more reliable compared to mechanical treatment processes. Dry-chemical plasma etch can be categorized into two groups, that of direct plasma whereby the plasma is ignited in the chamber adjacent to the wafer and that of remote plasma, where plasma is maintained outside the processing chamber. In the latter process the forming of the plasma and the place of etching are thus separate from one another. In this process, which is also referred to as remote-plasma-process, the plasma may for example be formed by introduction of microwaves into a tube, wherein gas, in particular the process gas, is introduced. In the plasma, radicals are generated which then pass into the etching chamber towards the surface to be etched.

The drawback of this etch process lies in the different etch rates distributed over the substrate. This difference in etch rate is caused by the directed supply of the radical stream originating from the plasma source into the etching chamber. Due to this distributed etch rate an uneven or non-uniform etch profile will form on the substrate. In general the radical stream is being directed towards the centre of the substrate in order to be able to etch the entire surface of the substrate. In the centre of the substrate, i.e. below the location where the radical stream is being introduced into the etching chamber, the removal of the central substrate material will hence be higher compared to the edge of the substrate.

To balance out the inhomogeneity of the distribution of reactive gases in a process wherein the plasma is remote to the site of reaction, the prior art suggests distribution plates and showerheads, respectively. For example in DE 697 13 080 T2 a showerhead is suggested, which is supposed to increase the uniformity within the distribution of gas over the surface of a substrate. This showerhead, similar to a distribution plate, comprises a number of gas inlets and gas outlets, which are arranged in a distributed fashion over the surface of the substrate.

Such distribution plates or showerheads are only partially effective for the distribution of the radical stream, which is directed towards the surface of the substrate to treat and especially to etch the surface. This is in particular due to the loss of radicals, which occurs when the radicals collide with the material of the showerhead or the distribution head. In addition the distribution of the radical stream is limited to the geometries preset by the openings or gas inlets and gas outlets.

The problem underlying the present invention is therefore to provide an etch process and an etching chamber allowing the distribution of the radical stream originating from a plasma source to be flexibly directed.

According to a first aspect the problem is solved by a process for etching a substrate in an etching chamber with the plasma being ignited outside of the etching chamber. The etching process is characterized in that during the etching process, when the radical stream is directed towards the substrate, at least temporarily at least one gas jet is laterally being directed towards the radical stream.

By the introduction of jets tangential and preferably horizontal to the radical stream, the direction of the radical stream can be affected. In contrast to the prior art solution this modification of the direction of the radical stream can be realized without significantly affecting the density of radicals and thus the efficiency of the radical stream. In addition the modification of direction can be flexibly adjusted according to the requirements of distribution of radicals. The radical stream can be manipulated without introducing radical destroying solid physical diffusion objects into the stream. The at least one gas jet is preferably introduced into the area of the radical stream by means of nozzles. The inventive process uses multiple jets to redistribute the etching process evenly over the entire wafer surface. With the inventive process also other desired distributions of the radical stream over the surface of the substrate can easily be establish.

Furthermore a recombination of radicals and atoms in the active species, in particular in the radical stream, does not occur with the inventive process. Hence, the etch rate, which is achievable with the standard radical stream, can be maintained as the density of radicals is unchanged and recombination is not significantly affected. At the same time the distribution of the removal of the substrate material can be adapted according to given requirements.

Preferably at least two gas jets are being used, wherein these jets are opposed, i.e. directed towards each other. Two opposing gas jets in line with each other will cause a collision area. As the opposing gas jets will be directed towards the radical stream the collision area will be within the radical stream, preferably in the centre of the radical stream. Hence, the gas jets and the collision area affect the flow of the radical stream and result in the redirecting of the radicals tangentially or essentially tangentially to the axis of the gas jets.

By means of the two opposing gas jets a continuous obstacle is thus formed. At this obstacle the radical stream will be deflected tangentially to the gas jets relative to the radical stream the latter will be divided or rather split. On a substrate arranged beneath the radical stream an etching profile will be created which will show a lower degree of removal of substrate material along the direction of gas jets in comparison to the area adjacent to this direction. The problem of over-etching the middle or centre of the substrate, i.e. underneath the inlet of the radical stream, can thus be avoided. In this respect it has shown that the induced collision zone separation of the radical stream allows for reliably and precisely presetting a desired etch profile.

Furthermore it has shown that employing two gas jets is advantageous for affecting the radical stream, since a profile with reflection or mirror symmetry can be achieved, which can be easily repeated in a subsequent etching step.

The arrangement of the nozzles, by which the gas jets are being created or are being introduced into the etching chamber, mainly depends upon the substrate to be treated in the chamber. The distance between two nozzles facing each other is chosen depending on the nozzle outlet. By variation of these two parameters the optimal collision area of the two gas jets can be created for deflecting the radical stream as desired. With a nozzle opening of for example 6 mm the distance between the two opposing nozzles can be 300 mm. With this distance the gas jet can fan out to have a diameter of approximately 70 mm in the area of the radical stream. This geometry, in particular the relation of the diameter of the nozzle and the distance of two opposing nozzles, governs the overall efficiency and performance of the system.

Preferably the gas jets are directed horizontally. Thereby the influence on the direction of the radical stream can be affected at a preset height and the split radical stream or its partial streams can spread out unimpeded below the injection height of the gas jets. Thereby a difference in etch rate over the surface of the substrate can be minimized.

Preferably the gas jets are pulsed. This means that a certain influence on the radical stream is only performed temporarily. If several inlets or nozzles for gas jets, which are directed towards the radical stream, are provided, different gas jets can be used at different times to influence the radical stream. In this case the gas jets are preferably pulsed in a rotational sequence. With this pulsing of the gas jets different areas of the substrate can be etched at different times to a different degree. Preferably several nozzles are provided in the etching chamber, which are being piloted or activated at different times. For example eight or twelve nozzles directed towards the centre of the etching chamber may be provided. If for example, two opposing nozzles out of eight nozzles arranged around the radical stream are being piloted, in a subsequent step after a given period of time these nozzles can be deactivated and two other opposing nozzles are used for introducing gas jets. With a continuously pulsed rotational sequence between the opposing gas jet pairs, a uniform etching rate over the entire surface of a substrate arranged below the radical stream will be achieved.

The duration of the paired gas inlet pulses can be set to minimise the thermal loading of the substrate, in particular a substrate carrying a tape. Pulses of one to five seconds can be used. Typically one second pulses are used and as such process heat is never allowed to accumulate in one location, potentially destroying the substrate. The continual heat loading of the central area is the common observed case without this invention.

In the process according to the invention, preferably the distance of the gas jets to the surface of the substrate is being altered in dependency of the size of the substrate to be etched or an appropriate etching chamber with the necessary geometries is being used. It has proven that by changing the distance or choosing an etching chamber with the necessary geometries, the efficiency of the radical stream deflection can be enhanced. The desired etching profile can also be achieved on larger substrates over the whole surface, i.e. over the whole diameter of the substrate. Further process parameters, which can be used for adjusting the desired etching profile or which can be modified, are in particular the jet flow rate, the flow rate of the process gas, the pressure in the etching chamber and the geometry of the nozzles, in particular the outlet diameter, relative position of opposing nozzles and substrate/jet/radical source height ratios. It should be noted that these parameters can be used for fine tuning the system efficiency for any desired etching profile.

The gas forming the gas jet for influencing the radical stream is preferably a gas, which is inert to the process gas of the etching process. According to one embodiment an energy carrier used in common plasma etch processes, such as for example Argon, Xenon or Nitrogen is being used. By using an inert gas, significant impairment of the radical efficiency can reliably be avoided.

According to a further aspect, the invention relates to an etching chamber for etching of substrates with a substrate holder and a plasma source remote to the substrate holder. The etching chamber is characterized in that in between the substrate holder and the plasma source at least one nozzle for lateral introduction of a gas jet in the etching chamber is provided. A single jet allows for radical stream deflection although the collision zone described previously is not produced.

Preferably the etching chamber comprises at least two opposing nozzles. The nozzles, which face each other, can be positioned at the edge of the etching chamber, that means provided in the side walls or inserted through the side walls either directly or over corresponding gas pipes. It is, however, also possible that the nozzles are inserted into the etching chamber through the upper side of the etching chamber. Herein the horizontal nozzles can be integrated in vertical gas pipes. This arrangement is advantageous in that the distance of the nozzles to the substrate and to the plasma source can be changed. By allowing an adjustment of this distance, substrates of different sizes can be treated in the same etching chamber and also different process parameters, such as the pressure in the chamber, can be accounted for.

Preferably the etching chamber comprises at least two pairs of opposing nozzles, which are connected to a control unit allowing a temporal piloting or activation of single pairs at a time. The control unit comprises preferably valves, which are connected to the nozzles. The valves are preferably arranged outside of the etching chamber. By means of the control unit it is possible to create an etching profile on the substrate to which the radical stream is directed. If opposing nozzle pairs are sequenced in rotation, symmetric etch profiles are produced tangential to the jet flow axis. The sequenced rotation of the nozzle pairs overlays these symmetric profiles, on the other and final after one complete revolution, all areas have been equally etched producing a homogeneous result.

With the inventive process and the inventive etching chamber a substrate can for example be treated after a mechanical treatment, such as grinding, in order to reduce stress within the substrate. This treatment is also referred to as stress relief treatment of the substrate. With the invention also other etching treatments of substrates can be performed, such as trench etching.

Advantages and characteristics mentioned in conjunction with the etch process are valid accordingly, as far as applicable, to the inventive etching chamber and vice versa.

The invention will be explained again referring to the attached figures. Wherein.

Figure 1:
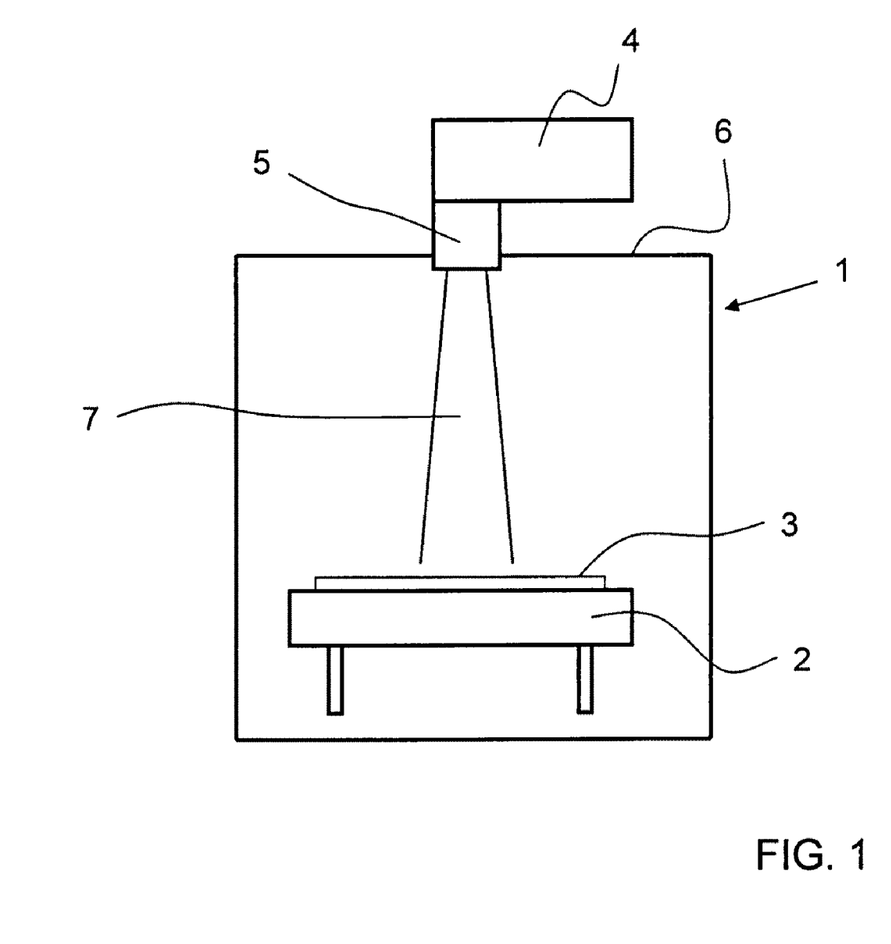
FIG. 1: shows a schematic view of an etching chamber.

In FIG. 1 the schematic assembly of an etching chamber 1 is shown. In this etching chamber 1 a substrate holder 2 is arranged, which is also referred to as a chuck. On this substrate holder 2 the substrate 3 to be treated, in particular a semiconductor substrate or wafer, is being held. Above the etching chamber 1 a plasma source 4 is arranged, which comprises a tube 5 for insertion of the radicals created in the plasma source 4 into the etching chamber 1. The plasma source 4 can for example be a plasma source, wherein the plasma is being produced by means of microwaves. Through leads, not shown, the process gases, as for example sulfurhexafluoride (SF6) or Tetrafluormethan (SF4), are being introduced into the plasma source 4. The lead or tube 5 for the active species generated in the plasma source 4, in particular the generated radicals, extends through the upper side 6 of the etching chamber 1. Thereby a radical stream 7 directed towards the substrate 3, is introduced into the etching chamber 1.

As can be derived from the schematic depiction in FIG. 1, the radical stream 7 is essentially directed towards the centre of the generally essentially circular substrate 3. Because the radical stream 7 fans out, also the edge region of the substrate 3 is at least partially etched. The etch rate at the edge is, however, considerably lower than the etch rate in the centre of the substrate 3. In order to achieve a predetermined etch rate in this etching chamber 1, the etching process has to be carried out until also at the edge the required amount of substrate material has been removed. This requires a long etching time. Due to the increased duration of etching an increase of temperature will occur in the substrate 3 and may lead to damaging of the substrate 3.

Figure 2:
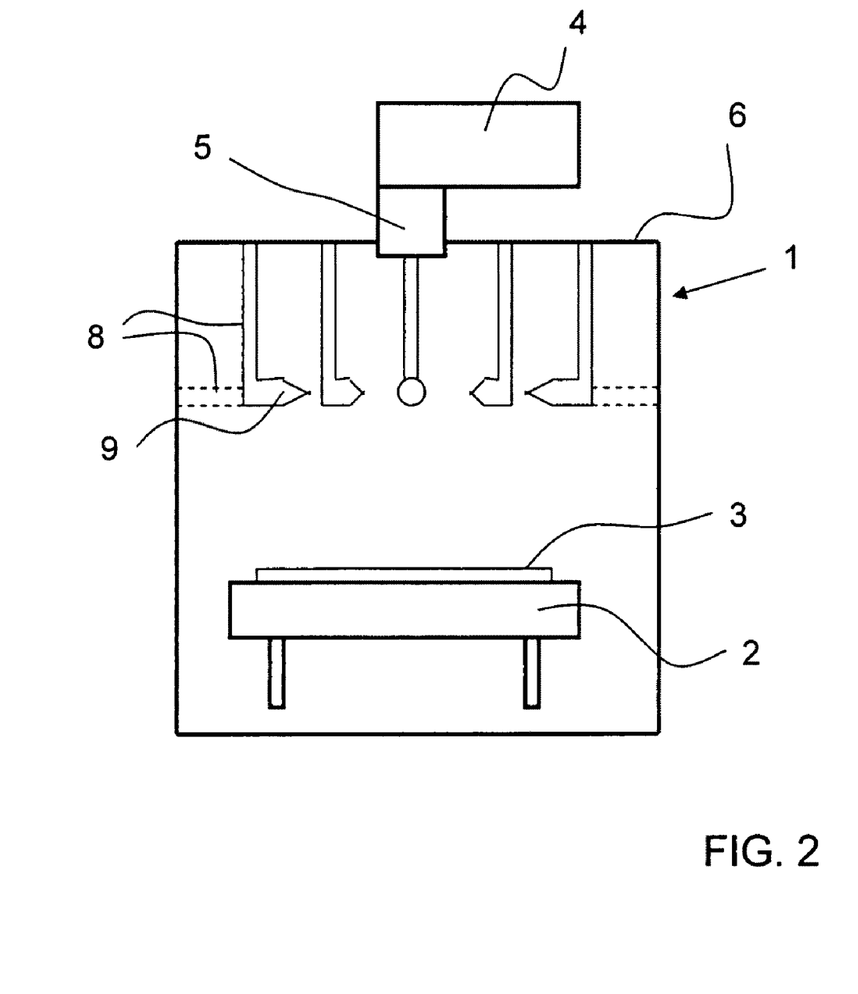
FIG. 2: shows a schematic, sectional view of one embodiment of the inventive etching chamber.

In FIG. 2 a schematic depiction of an embodiment of the inventive etching chamber 1 is shown. Also in this etching chamber 1 plasma is generated in a plasma source 4, which is located above the etching chamber 1 and the thus resulting radicals are introduced as a radical stream 7 into the etching chamber 1 from the upper side 6 of the etching chamber 1. The generally centrally positioned opening or tube 5 for the radical stream 7 is in the embodiment of FIG. 2 surrounded by eight gas pipes 8; only five being visible in the sectional view. These gas pipes 8 extend from the upper side 6 of the etching chamber 1 vertically downwards and terminate above the substrate holder 2. At the lower end the gas pipes are bent and lead to a horizontally directed nozzle 9. The nozzles 9 are directed towards the middle of the etching chamber 1, in particular to the centre of the projection of the tube 5 onto the substrate 3.

With the dashed line in FIG. 2 a different arrangement of the gas pipes 8 and nozzles 9 is shown. In this embodiment the gas pipes 8 extend horizontally through the side walls of the etching chamber 1 and lead to the horizontally directed nozzles 9. The vertical gas pipes 8 extending through the upper side of the etching chamber 1 would not be provided in that case.

Figure 3:
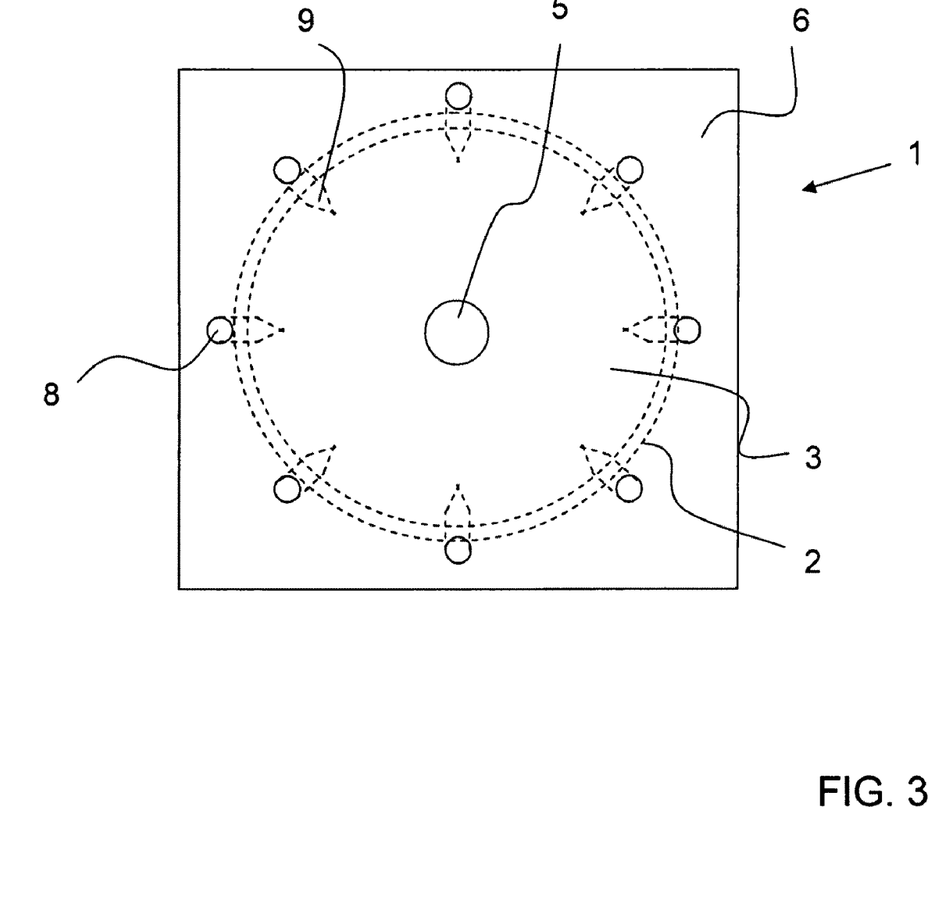
FIG. 3: shows a schematic top view of the etching chamber of FIG. 2.

As can be derived from the top view of the etching chamber 1 of FIG. 2 in FIG. 3, eight gas pipes 8 with nozzles 9 are provided The nozzles 9 are directed in such a way, that these are opposed to each other in pairs. Preferably the nozzles 9 are only piloted or activated in pairs, that means only through two opposing nozzles 9 will gas be simultaneously introduced into the etching chamber 1.

The nozzles 9 end in the depicted embodiment in the area of the edge of the substrate 3. It is however also possible to arrange the nozzles 9 further displaced outwards from the substrate 3.

Figure 4:
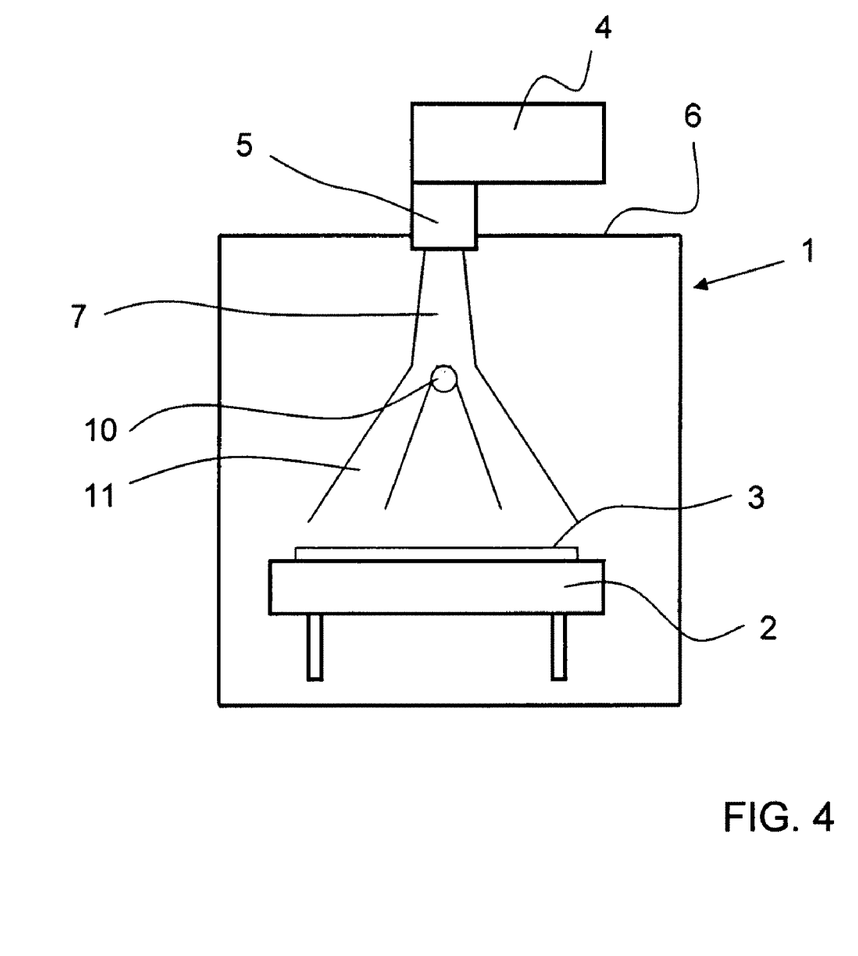
FIG. 4: is a schematic depiction of the radical stream with a gas jet directed towards the radical stream.

If through two opposing nozzles 9 a gas jet 10 is fired from each nozzle 9, the two horizontal gas jets 10 will impinge upon or collide with each other in the middle, that means in the centre of the radical stream 7 and thus form an obstacle for the radical stream 7. The radical stream 7 directed from the top towards the substrate 3 is deflected at the gas jet 10. In particular the radical stream 7 will be split, as schematically shown in FIG. 4, and will form two partial streams 11. The depiction of the radical stream 7 and its partial streams 11 in FIG. 4 is of schematic nature only. It is well understood that below the gas jets 10 the radicals will mix with the gas of the gas jets 10. In the middle of the substrate 3 the density of radicals on the surface of the substrate will, however, be lower compared to an unimpeded course of the radical stream 7 and the removal of substrate material at this position will thus be reduced.

Figure 5:
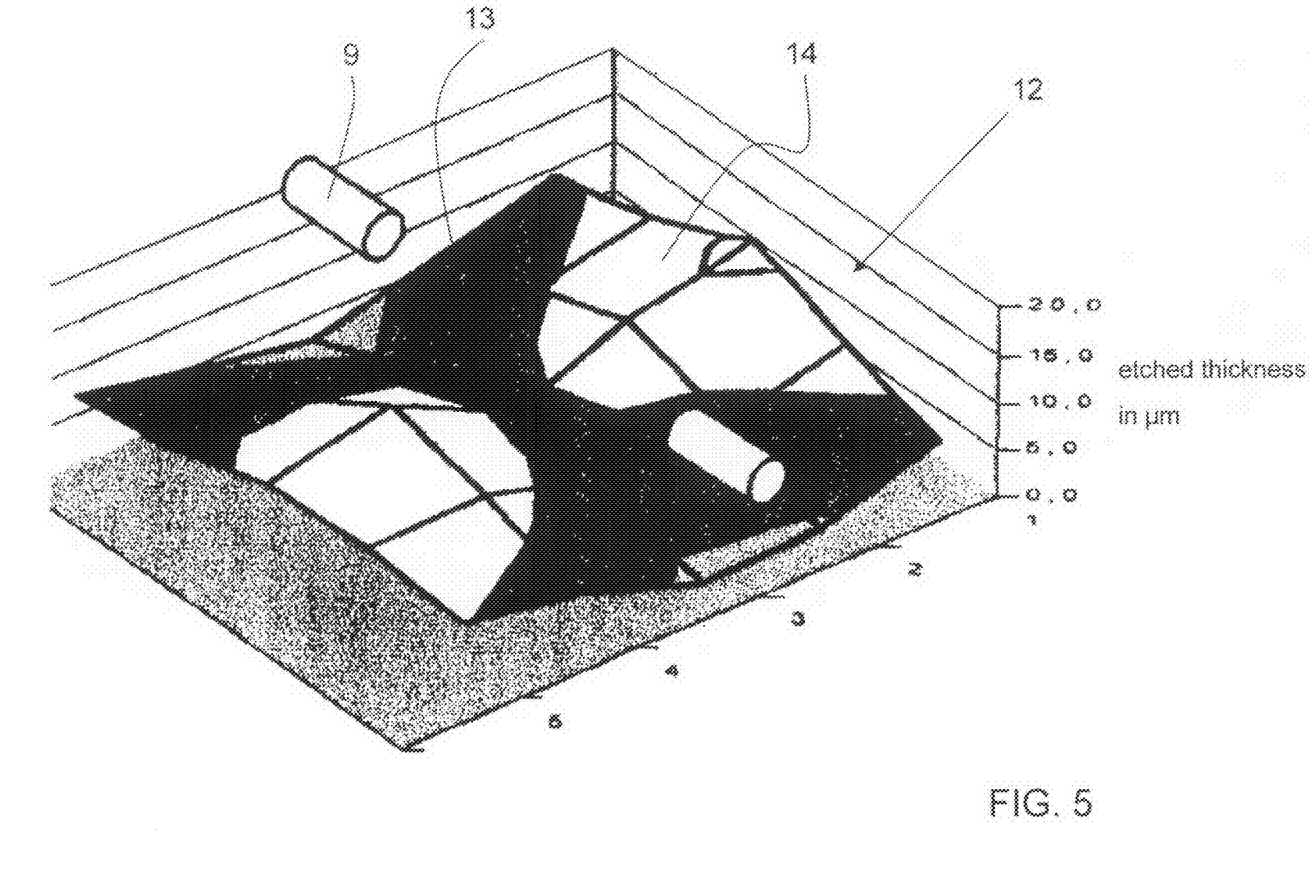
FIG. 5: is a schematic depiction of an etching profile.

With two opposing gas jets 10 an etching profile 12 as shown in FIG. 5 may be obtained. In the area of the gas jets 10, the direction of which is indicated in FIG. 5 by the two nozzles 9, a removal of substrate material of less than 5 μm was obtained with preset process conditions. This area is indicated as the darker field 13 in the profile 12. Whereas in a distance to the gas jets 10 a removal of substrate material of up to 10 μm was obtained. This is indicated by the light area 14 in the profile 12.

This etching profile 12 can be further treated in a subsequent etching step. In this next step preferably gas jets 10 are being used to influence the radical stream 7, which have a different orientation compared to the gas jets 10 used in the first etching step. In particular gas jets 10 are used, which are offset by an angle to the gas jets 10 used before.

For example a pair of opposed nozzles, which is adjacent to the pair of nozzles used in the first step, is being used for the subsequent etching step, and the etching process is carried out for a certain period of time with the thus split radical stream 7, before the gas supply via the nozzles 9 is stopped. If this switching between adjacent pairs of nozzles for example in a clockwise direction, is carried out consecutively a homogeneous etching profile will be obtained.

When changing from one pair of nozzles to another one, for example an adjacent pair, in particular the area of the substrate 3, which was subjected to a lower degree of removal in the previous etching step will be subjected to a higher radical density and the unevenness on the substrate surface created in the previous etching step can be compensated.

By changing the direction of the gas jet 10, that means by the timely-staggered piloting of nozzles 9 and in particular of pairs of nozzles 9, the etching profile on the surface of the substrate 3 can be created homogeneously. In particular an over-etching of the centre of the substrate can be avoided.

Figure 6:
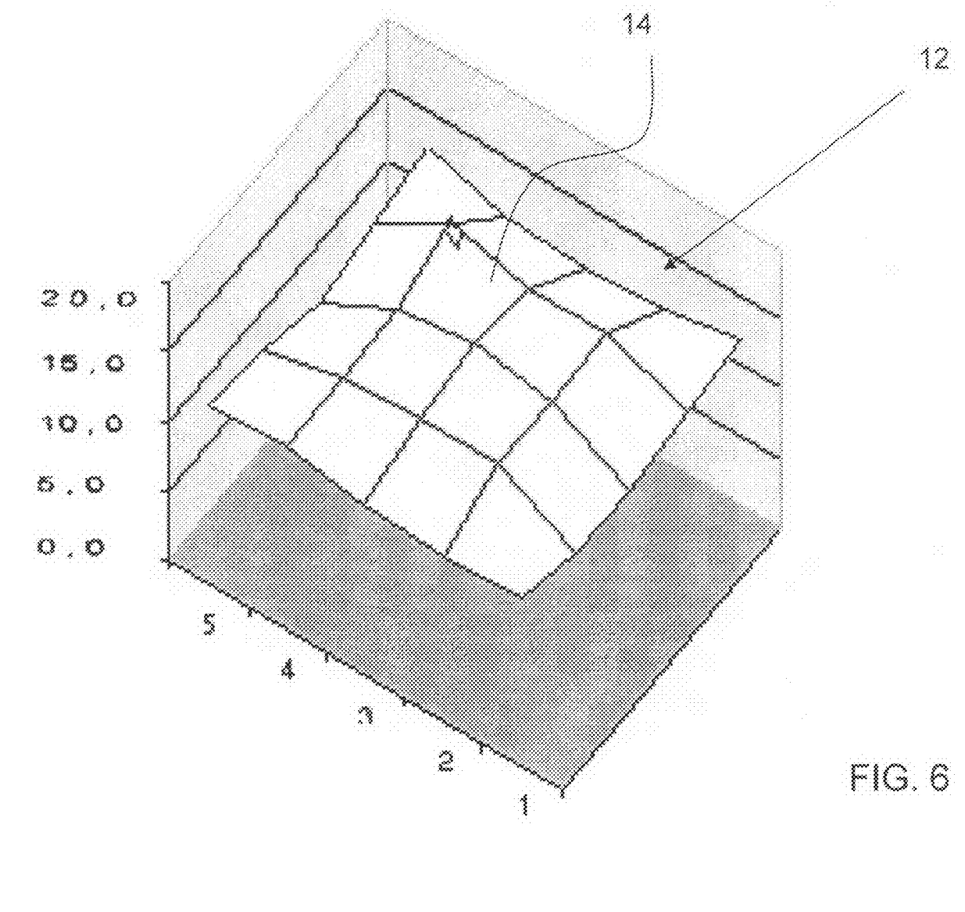
FIG. 6: is a schematic depiction of another etching profile.

On completion rotation through all jets, sequential etch profiles 12 are overplayed and after 360 degrees a predominately equal substrate removal has been performed across the entire substrate. This final etch profile is schematically shown in FIG. 6. Several rotations can be performed per process. With more than one rotation, for example 30 complete rotations per process, the start and stop position is largely insignificant.

Figure 7:
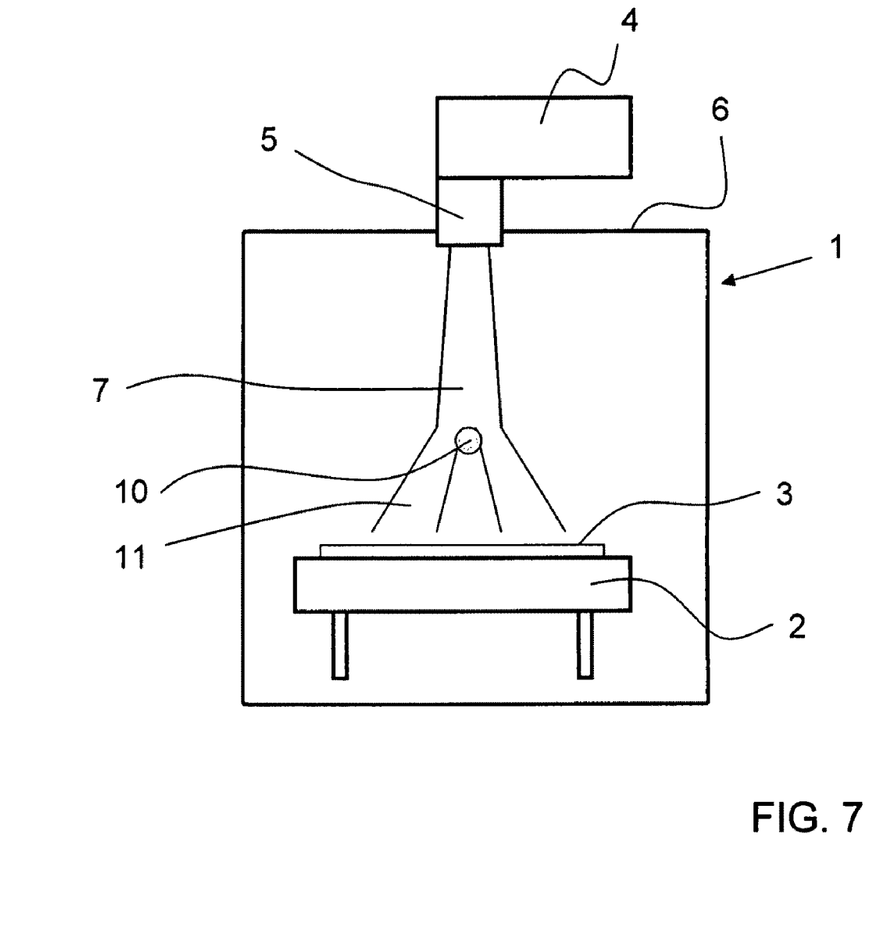
FIG. 7: is a further schematic depiction of the radical stream with a gas jet directed towards the radical stream.

The shape of the radical stream 7, that means the distribution of the radicals, can be further influenced by among other parameters, such as the chamber pressure in the etching chamber 1, the pressure or flow rate of the gas jet or gas jets 10 and the flow rate of the process gas also by the distance of the introduction of the gas jets 10, that means the distance of the nozzles 9 to the substrate 3. If, under otherwise unchanged process conditions, the distance to the substrate holder 2 is lowered, the distance between the partial streams 11, which reach the surface of the substrate, will be lowered. This condition is schematically shown in FIG. 7. Also in this depiction the partial streams 11 are only shown schematically. Below the gas jets 10 the gas of the gas jets and the radicals of the radical stream 7 will of course mix. The density of radicals in the centre of the substrate 3 will, however, be lower in comparison to an unimpeded radical stream 7, whereby the removal of material in the centre will also be lower.

In order to obtain a homogeneous etching profile on a substrate 3 of smaller diameter, the introduction of the gas jets 10 will be carried out at a smaller distance to the substrate 3. If the gas is introduced at a larger distance to the substrate 3, this results in general in a reduction of the necessary gas pressure or flow rate to obtain the same homogeneity. It has, however, proven that the etch rate drops with the introduction of the gas jets 10 being arranged higher. A so called Doughnut-Effect, where in an annular area around the centre a higher etch rate is being obtained than in the centre and at the edge of the substrate, can be avoided with a higher positioned inlet point for the gas jets.

The introduction of the gases close to the substrate 3 in contrast, leads to the following effects. On one hand the etching speed is increased with otherwise unchanged process conditions, which is due to the higher efficiency of the radicals. The lower the gas jets 10 are introduced, however, the flow rate, which has to be adjusted in order to obtain a prescribed homogeneity, increases and the danger of the forming of an annular or doughnut profile increases.

If the radical stream is increased that means if the density of the radicals in the radical stream 7 is increased or the flow rate of the process gas is increased, the effect of the forming of an annular profile in increased. In addition an increased flow rate of the gas jets is necessary with a higher radical stream 7 flow rate in order to ensure splitting of the radical stream 7.

As already described above, it has proven that the height of the inlet of the gases for the gas jets 10 above the substrate 3 into the etching chamber 1 contributes to the homogeneity of the etching profile.

Finally also the chamber pressure in the etching chamber 1 is relevant for the shape that the radical stream 7 will adopt. If the pressure in the etching chamber is for example increased from 150 Pa to 300 Pa, the deflection or the splitting of the radical stream 7 will be stronger.

By modifying the parameters, which influence the flow of the radical stream 7, the desired etching profile can be achieved, for example a homogeneous etching rate over the entire surface of the substrate can be achieved. Due to the improved homogeneity also higher etching rates will become possible.

The invention is not limited to the embodiments shown in the figures. In particular it is also possible to lead the gas pipes which serve as the inlet of gas to the nozzles through the side walls of the etching chamber.

Even though in the present description generally forming a homogeneous etching profile on a substrate has been emphasised, the present invention also provides the possibility to obtain a different etching profile, for example an etching profile with a higher etching rate on one side of the substrate.

In addition it is also possible to direct three or four gas jets simultaneously towards the radical stream. Also the use of a single gas jet for influencing the radical stream lies within the scope of the invention. The number of gas jets used will be chosen according to the desired etching profile. With the present invention it is hence possible to either obtain a homogeneous etching rate over the surface of the substrate or to obtain an predetermined higher etching rate on parts of the substrate.

With the present invention it is thus possible to influence the etching profile on a substrate in an easy way and to control the etching profile during the etch process. It is in particular possible to obtain a homogeneous etching profile also on larger substrates such as for example a 12"-wafer. Since the affecting of the etching profile is performed by gas jets, the intensity of the influence and the direction of the influence can easily be adapted to further conditions, in particular to the process parameters.

The invention claimed is:

1. Process for etching a substrate in an etching chamber with a plasma ignited outside of the etching chamber, characterized in that during the etching process at least temporarily at least two gas jets are directed from the side to a radical stream which is directed towards the substrate in order to distribute the radical stream for the etching process over the surface of the substrate and further characterized in that the gas jets are pulsed.

2. Process according to claim 1, characterized in that at least two opposing gas jets are being used.

3. Process according to claim 1, characterized in that the gas jets are directed horizontally.

4. Process according to claim 1, characterized in that the distance of the gas jets to the substrate is changed dependent on the size of the substrate to be etched.

5. Process according to claim 1, characterized in that the gas of the gas jets is inert to the process gas of the etching process.

* * * * *